United States Patent
Ma et al.

(10) Patent No.: US 9,876,038 B2
(45) Date of Patent: Jan. 23, 2018

(54) ARRAY SUBSTRATE AND MANUFACTURING METHOD THEREOF AND DISPLAY DEVICE

(71) Applicant: BOE TECHNOLOGY GROUP CO., LTD., Beijing (CN)

(72) Inventors: Yinghai Ma, Beijing (CN); Liangjian Li, Beijing (CN); Yueping Zuo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/238,970

(22) Filed: Aug. 17, 2016

(65) Prior Publication Data

US 2017/0194363 A1    Jul. 6, 2017

(30) Foreign Application Priority Data

Jan. 5, 2016    (CN) .......................... 2016 1 0007037

(51) Int. Cl.
*H01L 27/14*    (2006.01)
*H01L 27/12*    (2006.01)
(Continued)

(52) U.S. Cl.
CPC .... *H01L 27/1255* (2013.01); *H01L 21/31116* (2013.01); *H01L 27/127* (2013.01);
(Continued)

(58) Field of Classification Search
CPC .......... H01L 21/31116; H01L 27/1255; H01L 27/127; H01L 29/78621; H01L 27/1288; H01L 29/66757; H01L 27/1248
See application file for complete search history.

(56) References Cited

U.S. PATENT DOCUMENTS

2002/0158995 A1*  10/2002  Hwang ............. G02F 1/136227
                                                    349/43
2005/0118827 A1*  6/2005  Sato .................. H01L 21/31116
                                                    438/700
(Continued)

FOREIGN PATENT DOCUMENTS

CN    103700706 A    4/2014
CN    104282769 A    1/2015
CN    104332477 A    2/2015

OTHER PUBLICATIONS

First Office Action dated Dec. 1, 2017 corresponding to Chinese application No. 201610007037.6.

*Primary Examiner* — Trung Q Dang
*Assistant Examiner* — Wasiul Haider
(74) *Attorney, Agent, or Firm* — Nath, Goldberg & Meyer; Joshua B. Goldberg

(57) ABSTRACT

A manufacturing method of an array substrate comprises: forming a source and a drain of a thin film transistor on a base; forming a first insulation layer; forming an active layer of the thin film transistor; forming a second insulation layer; forming a first via hole and a second via hole in the first insulation layer and the second insulation layer above the source and the drain, by etching, and forming a third via hole and a fourth via hole in the second insulation layer above the active layer, by etching; forming a first connection line connecting the source with the active layer through the first via hole and the third via hole, a second connection line connecting the drain with the active layer and the pixel electrode through the second via hole and the fourth via hole and a pixel electrode.

20 Claims, 2 Drawing Sheets

(51) Int. Cl.
*H01L 29/786* (2006.01)
*H01L 21/311* (2006.01)
*H01L 29/66* (2006.01)

(52) U.S. Cl.
CPC ...... *H01L 27/1248* (2013.01); *H01L 27/1288* (2013.01); *H01L 29/66757* (2013.01); *H01L 29/78621* (2013.01)

(56) References Cited

U.S. PATENT DOCUMENTS

| | | | | |
|---|---|---|---|---|
| 2014/0145179 | A1* | 5/2014 | Yoon | H01L 29/66969 257/43 |
| 2015/0214286 | A1* | 7/2015 | Niu | H01L 27/3276 257/72 |
| 2016/0056267 | A1* | 2/2016 | Wang | H01L 29/66969 257/43 |
| 2016/0148838 | A1* | 5/2016 | Shu | H01L 27/124 257/72 |
| 2016/0293770 | A1* | 10/2016 | Peng | H01L 29/78621 |
| 2016/0307988 | A1* | 10/2016 | Kim | H01L 27/3262 |

\* cited by examiner

ARRAY SUBSTRATE AND MANUFACTURING METHOD THEREOF AND DISPLAY DEVICE

FIELD

The present application relates to the field of display technology, and particularly to an array substrate and a manufacturing method thereof, and a display device.

BACKGROUND

With the development of display technology, people's demand on image quality is increasing, and flat panel display devices with high quality and high resolution are becoming more and more popular, and have been paid more and more attention by display panel manufacturers.

Thin film transistors (TFTs) are main driving devices in a flat display panel, which directly affect the development direction of high performance flat panel display devices. A thin film transistor may be of various structures, and there are various materials for manufacturing the thin film transistors of corresponding structures, for example, amorphous silicon and polysilicon are commonly used in the manufacture of thin film transistors. However, amorphous silicon itself has many inherent shortcomings such as low mobility and low stability, and in contrast, low temperature polysilicon (LTPS) has high stability and mobility which may be, for example, up to tens or even hundreds of times of that of amorphous silicon. Therefore, the technique in which the thin film transistor is made of low temperature polysilicon has been developed rapidly, and new generation liquid crystal display (LCD) devices or organic light-emitting diode (OLED) display devices derived from LTPS have become an important display technology, especially the OLED display devices have been acclaimed by users for their characteristics such as ultra-thinness, low power consumption and self-emission.

FIG. 1 is a sectional diagram of a structure of a LTPS TFT array substrate in the prior art. The array substrate comprises a buffer layer 2, an active layer 3, a first insulation layer 4', a gate 5, a second insulation layer 6', a source 71, a drain 72, a third insulation layer 8', a planarization layer 9 and a pixel electrode 10 sequentially provided on a base 1. At present, the array substrate of this structure may be manufactured by eight patterning processes using eight masks, wherein the eight patterning processes include:

forming a pattern including the active layer 3 through a first patterning process by using an active layer mask (a-Si Mask);

performing a partial p-Si doping on the first insulation layer 4' to form a pattern including a first plate 11 of a storage capacitor Cs through a second patterning process by using a storage capacitor mask (Cs mask). In this step, the first plate 11 of the storage capacitor Cs is formed by doping through a first ion implantation, however, the storage capacitor Cs in which the first plate 11 formed by using the ion implantation has a disadvantage of slow charging and discharging;

forming a pattern including a gate 5 and a second plate 12 of the storage capacitor Cs through a third patterning process by using a gate mask. In this step, a gate metal is used as the second plate 12 of the storage capacitor Cs;

forming a pattern including contact holes connecting the source 71 and the drain 72 with the active layer 3 in the second insulation layer 6' through a fourth patterning process by using a contact mask;

forming a pattern including the source 71 and the drain 72 through a fifth patterning process by using a source/drain mask (S/D mask);

forming a pattern including a bridge via hole between the pixel electrode 10 and the drain 72 in the third insulation layer 8' through a sixth patterning process by using a via hole mask;

forming a pattern including a bridge via hole between the pixel electrode 10 and the drain 72 in the planarization layer 9 through a seventh patterning process by using a planarization mask (PLN mask), and making the array substrate be planarized so as to deposit a electrode layer on the planarized substrate; and forming a pattern including the pixel electrode 10 through an eighth patterning process by using a pixel electrode mask (ITO mask).

It can be seen that the existing manufacturing process for the array substrate including the LTPS and Cs is complicate and has relatively more procedures, resulting in a high production cost.

SUMMARY

In view of the above problems in existing manufacturing method of the array substrate, the present application provides an array substrate, which is simple in manufacturing process and low in production cost, a manufacturing method thereof, and a display device.

A solution employed to solve the technical problems is a manufacturing method of an array substrate, which comprises the following steps of:

forming a pattern including a source and a drain of a thin film transistor on a base through a patterning process;

forming a first insulation layer;

forming a pattern including an active layer of the thin film transistor through a patterning process;

forming a second insulation layer, forming a first via hole and a second via hole in the first insulation layer and the second insulation layer above the source and the drain, respectively, by etching, and forming a third via hole and a fourth via hole in the second insulation layer above a source contact region and a drain contact region of the active layer, respectively, by etching;

forming a pattern including a first connection line, a second connection line and a pixel electrode through a patterning process, wherein the first connection line connects the source with the source contact region of the active layer through the first via hole and the third via hole, the second connection line connects the drain with the drain contact region of the active layer and the pixel electrode through the second via hole and the fourth via hole.

Optionally, the step of forming the second insulation layer comprises a step of:

forming a gate insulation layer and forming a planarization layer, the manufacturing method further comprises a step of:

between forming the gate insulation layer and forming the planarization layer, forming a pattern including a gate of the thin film transistor through a patterning process.

Further optionally, orthographic projections of the gate and a conductive channel region of the active layer on the base completely coincide with each other, and after forming the pattern including the gate through a patterning process, the manufacturing method further comprises a step of:

performing an ion implantation on the active layer to form the source contact region and the drain contact region.

Further optionally, while forming the pattern including the active layer of the thin film transistor through a patterning process, the manufacturing method further comprises a step of:

forming a pattern including a first plate of a storage capacitor, and while performing the ion implantation on the active layer to form the source contact region and the drain contact region, the manufacturing method further comprises a step of:

performing an ion implantation on the first plate of the storage capacitor.

Optionally, while forming the pattern including the source and the drain of the thin film transistor through a patterning process, the manufacturing method further comprises a step of:

forming a pattern including the gate of the thin film transistor.

Optionally, while forming the pattern including the source and the drain of the thin film transistor through a patterning process, the manufacturing method further comprises a step of:

forming a pattern including a second plate of the storage capacitor.

Optionally, the step of forming the first via hole and the second via hole in the first insulation layer and the second insulation layer above the source and the drain, respectively, by etching; and forming a third via hole and a fourth via hole in the second insulation layer above the source contact region and the drain contact region of the active layer, respectively, by etching specifically comprises steps of: first, etching regions, which correspond to the first though hole and the second via hole, in the first insulation layer and the second insulation layer above the source and the drain; and next, etching regions, which correspond to the third via hole and a fourth via hole, in the second insulation layer above the source contact region and the drain contact region of the active layer.

Further optionally, etching gas used in etching the second insulation layer to form the third via hole and the fourth via hole is $C_xF_y$.

Optionally, after the pattern including the pixel electrode is formed, the manufacturing method further comprises a step of:

forming a pattern including a pixel defining layer and a spacer through a single patterning process.

A solution employed to solve the technical problems is an array substrate, which comprises:

a base;

a source and a drain of a thin film transistor above the base;

a first insulation layer above a layer in which the source and the drain are located;

an active layer of the thin film transistor above the first insulation layer;

a second insulation layer above a layer in which the active layer is located;

a first connection line, a second connection line and a pixel electrode above a layer in which the second insulation layer is located, wherein the first connection line connects the source with the source contact region of the active layer via the first via hole penetrating through the first insulation and the second insulation layer above the source and the third via hole penetrating through the second insulation layer above the source contact region of the active layer , the second connection line connects the drain with the drain contact region of the active layer and the pixel electrode via the second via hole penetrating through the first insulation layer and the second insulation layer above the drain and the fourth via hole penetrating through the second insulation layer above the drain contact region of the active layer.

Optionally, the second insulation layer includes a gate insulation layer and a planarization layer, and the array substrate further comprises a gate of the thin film transistor provided between the gate insulation layer and the planarization layer.

Optionally, orthographic projections of the gate and a conductive channel region of the active layer on the base completely coincide with each other, and the source contact region and the drain contact region of the active layer are doped with ions.

Further optionally, the array substrate further comprises a first plate of a storage capacitor, wherein the first plate and the active layer are in a same layer and are formed of a same material, and the first plate is doped with ions.

Optionally, the array substrate further comprises a gate of the thin film transistor, wherein the gate and the source and the drain are in a same layer and are made of a same material.

Optionally, the array substrate further comprises a second plate of the storage capacitor, wherein the second plate and the source and the drain are in a same layer and are made of a same material.

A solution employed to solve the technical problems is an array substrate comprising the above array substrate.

DETAILED DESCRIPTION OF THE EMBODIMENTS

To make persons skilled in the art better understand solutions of the present application, description of the present application will be described in detail below in conjunction with the accompanying drawings and specific implementations.

In the present application, a patterning process may only include a photolithography process or may include a photolithography process and an etching step, and in addition, may further include other processes for forming a predetermined pattern, such as a printing and ink jet. The photolithography refers to a process which includes procedures such as a film forming, an exposure and a development and the like, and forms a pattern by using a photoresist, a mask and an exposure machine and the like. A corresponding patterning process may be selected in accordance with a structure to be formed.

First Embodiment

With reference to FIGS. 2 to 7, the present embodiment provides a manufacturing method of an array substrate, which specifically comprises the following steps.

Figure 1:
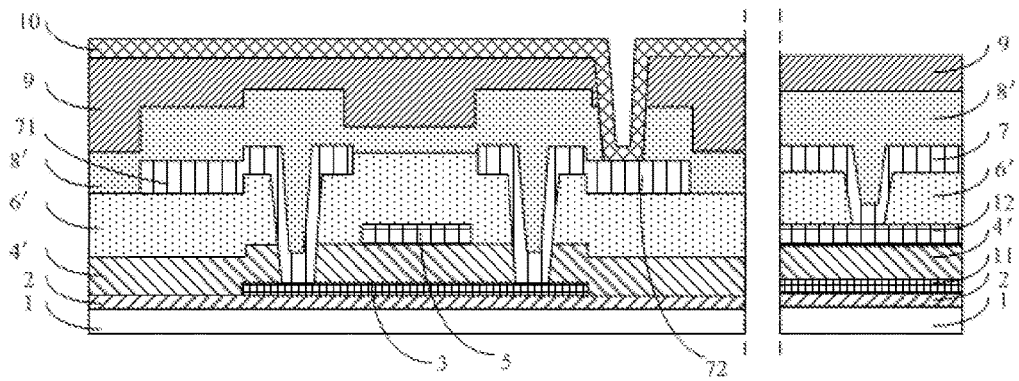
FIG. 1 is a structural diagram of an existing array substrate.
Figure 2:
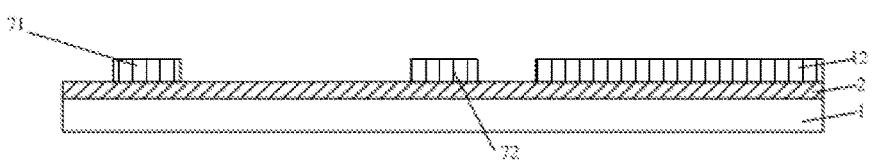
FIG. 2 is a diagram illustrating a first step of a manufacturing method of the array substrate in a first embodiment of the present application.

Step 1, sequentially depositing a buffer layer 2 and a source-drain metal film on a base 1, and forming a pattern including a source 71 and a drain 72 of a thin film transistor and a second plate 12 (a lower plate) of a storage capacitor through a single patterning process, as shown in FIG. 2.

In this step, the base 1 is made of a transparent material such as glass and is cleaned in advance. Specifically, first, the source-drain metal film is formed on the base 1 by using a sputtering method, a thermal evaporation method, a Plasma Enhanced Vapor Deposition (PECVD) method, a Low Pressure Chemical Vapor Deposition (LPCVD) method, an Atmospheric Pressure Chemical Vapor Deposition (APCVD) method, or an Electron Cyclotron Resonance Chemical Vapor Deposition (ECR-CVD) method. Then, a pattern including a source 71, a drain 72 and a second plate 12 is formed through a first patterning process (which includes a film forming, an exposure, a development, a wet etching or a dry etching).

Figure 3:
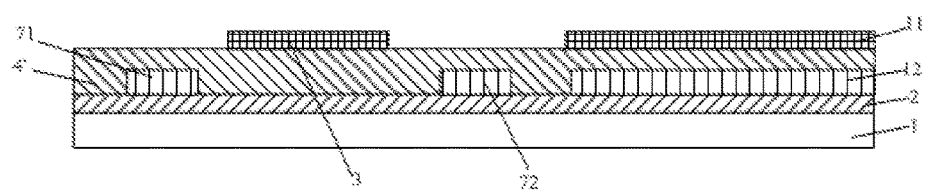
FIG. 3 is a diagram illustrating a second step of the manufacturing method of the array substrate in the first embodiment of the present application.

Step 2, on the base 1 subject to the step 1, sequentially depositing a first insulation layer 4' and an amorphous silicon film (a-Si), and forming a pattern including an active layer 3 of the thin film transistor and a first plate 11 (a top plate) of the storage capacitor through a patterning process, as shown in FIG. 3.

In this step, first, deposition methods include a Plasma Enhanced Vapor Deposition method and a Low Pressure Chemical Vapor Deposition method;

Then, the amorphous silicon film is crystallized so as to convert the amorphous silicon film 30 into a polysilicon film (p-Si), wherein crystallization method may be an excimer laser crystallization method, a metal induced crystallization method or a solid phase crystallization method. Then the polysilicon film (p-Si) is doped (p-type doped or n-type doped) to decide a conduction type of a conductive channel region of the thin film transistor TFT. The excimer laser crystallization method and the metal induced crystallization method are low temperature polysilicon methods, which are frequently used to convert the amorphous silicon into the polysilicon. However, methods used for converting the amorphous silicon into the polysilicon in the present application are not limited to the above low temperature polysilicon methods, so long as the active layer 3 may be converted into a desired polysilicon film.

Figure 4:
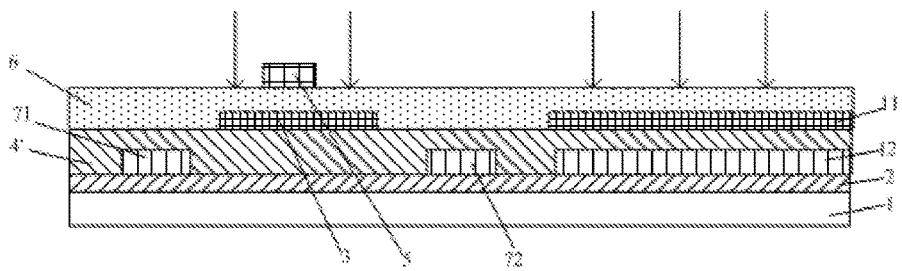
FIG. 4 is a diagram illustrating a third step of the manufacturing method of the array substrate in the first embodiment of the present application.

Step 3, on the base 1 subject to the step 2, sequentially depositing a gate insulation layer 6 (that is, a first level structure of a second insulation layer) and a gate metal film, and forming a gate 5 through a patterning process, as shown in FIG. 4.

In this step, first, the gate insulation layer is formed above the active layer 3 and the first plate 11 by using a Plasma Enhanced Vapor Deposition (PECVD) method, a Low Pressure Chemical Vapor Deposition (LPCVD) method, an Atmospheric Pressure Chemical Vapor Deposition (APCVD) method, an Electron Cyclotron Resonance Chemical Vapor Deposition (ECR-CVD) method, or a sputtering method. Next, the gate metal film is deposited by using a sputtering method, a thermal evaporation method, a Plasma Enhanced Vapor Deposition (PECVD) method, a Low Pressure Chemical Vapor Deposition (LPCVD) method, an Atmospheric Pressure Chemical Vapor Deposition (APCVD) method, or an Electron Cyclotron Resonance Chemical Vapor Deposition (ECR-CVD) method. Finally, the pattern including a gate 5 of the thin film transistor is formed through a patterning process, wherein orthographic projections of the gate 5 and the conductive channel region of the active layer on the base 1 completely coincide with each other.

This step further comprises a step of: doping corresponding portions of the active layer (p-Si) 3 to form a source contact region and a drain contact region, so as to enhance ohmic contact between the active layer 3 and the source 71 and the drain 72, thus good ohmic contact between the p-Si and the source 71 and the drain 72 can be ensured. A region of the active layer 3 corresponding to the gate 5 need not to be doped, since this doping is performed after the etching of the pattern of the gate 5, p-Si in the region of the active layer 3 corresponding to the gate 5 cannot be doped due to blockage of the gate 5. Meanwhile, the p-Si in the region of the active layer 3 corresponding to the gate 5 will act as a channel and thus need not to be doped. Ion implantation methods include an ion implantation method with mass analyzer, an ion cloud implantation method without mass analyzer, a plasma implantation method or a solid state diffusion implantation method. That is, in this embodiment, through a plurality of steps including a crystallization step, a doping step and an ion implantation step and the like, the low temperature polysilicon is finally formed as the active layer 3 with good semiconductor property. Certainly, ion implantation is performed on the first plate 11 of the storage capacitor while doping the source contact region and the drain contact region, so as to enhance the electric characteristics of the first plate 11.

Figure 5:
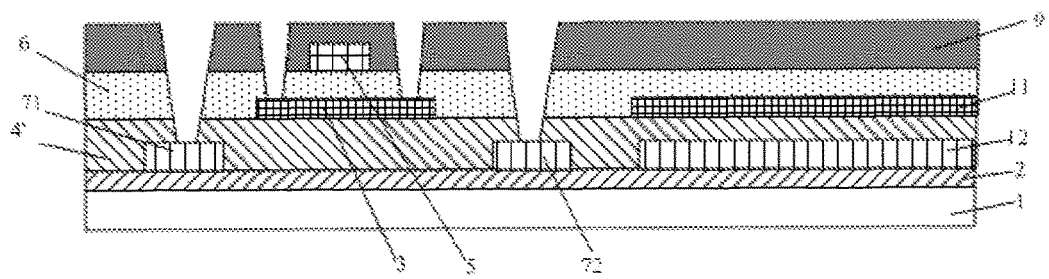
FIG. 5 is a diagram illustrating a fourth step of the manufacturing method of the array substrate in the first embodiment of the present application.

Step 4, on the base 1 subject to the step 3, depositing a planarization layer 9 (a second level structure of the second insulation layer), and forming, by etching, a first via hole and a second via hole in the first insulation layer 4', the gate insulation layer 6 and the planarization layer 9 above the source 71 and the drain 72; and forming, by etching, a third via hole and a fourth via hole in the gate insulation layer 6 and the planarization layer 9 above the source contact region and the drain contact region of the active layer 3, as shown in FIG. 5.

In this step, first, the source contact region and the drain contact region of the active layer 3 become semi-transmittance regions by using a half tone mask (HTM) or a gray tone mask (GTM), so that, after exposure, a part of photoresist is remained in these regions. After this, when performing a plasma etching, regions corresponding to the first via hole and the second via hole are etched first, and following removal of the photoresist on the surface of the array substrate, regions corresponding to the third via hole and the fourth via hole are etched. Specifically, the first via hole and the second via hole may be formed first by etching, and following the removal of the photoresist on the surface of the array substrate, the third via hole and the fourth via hole are finally formed by etching. Since the source 71 and the drain 72 are below the first via hole and the second via hole, an etching gas used in the etching is $C_xF_y$ gas, which cannot etch metal so that structures of the source 71 and the drain 72 cannot be damaged. It should be noted that, the $C_xF_y$ gas refers to a compound containing C (carbon) and F (fluorine), such as $CF_4$ (carbon tetrafluoride), $C_4F_8$ (octafluorocyclobutane), $C_2HF_5$ (pentafluoroethane) or the like.

Figure 6:
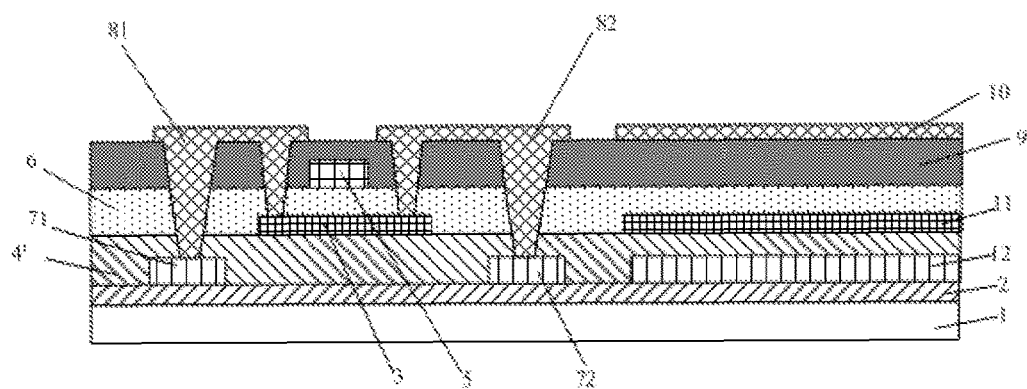
FIG. 6 is a diagram illustrating a fifth step of the manufacturing method of the array substrate in the first embodiment of the present application.

Step 5, on the base 1 subject to the step 4, forming a pattern including a first connection line 81, a second connection line 82 and a pixel electrode 10 through a patterning process, wherein the first connection line 81 connects the source 71 with the source contact region of the active layer 3 through the first via hole and the third via hole; the second connection line 82 connects the drain 72 with the drain contact region of the active layer 3 and the pixel electrode 10 through the second via hole and the fourth via hole, as shown in FIG. 6.

In this step, a conductive metal film is deposited by using a sputtering method, a thermal evaporation method, a Plasma Enhanced Vapor Deposition (PECVD) method, a Low Pressure Chemical Vapor Deposition (LPCVD) method, an Atmospheric Pressure Chemical Vapor Deposition (APCVD) method, or an Electron Cyclotron Resonance Chemical Vapor Deposition (ECR-CVD) method. The conductive metal film has a high reflectivity and satisfies a certain requirement to work function of metal, and is generally of a double-layered-film structure or a three-layered-film structure, such as an ITO (indium tin oxide)/Ag (silver)/ITO (indium tin oxide) or Ag (silver)/ITO (indium tin oxide); alternatively, ITO of the above structure may be replaced by IZO (indium zinc oxide), IGZO (indium gallium zinc oxide) or InGaSnO (indium gallium tin oxide). Certainly, the conductive metal film may also be made of inorganic metal oxide, organic conductive polymer or metal material with conductive property and high work function, wherein the inorganic metal oxide includes indium tin oxide or zinc oxide, the organic conductive polymer includes PEDOT:SS, PANI, and the metal material includes gold, copper, silver or platinum.

Next, the pattern including a first connection line 81, a second connection line 82 and a pixel electrode 10 is formed through a single patterning process, wherein the first connection line 81 connects the source 71 with the source contact region of the active layer 3 through the first via hole and the third via hole; the second connection line 82 connects the drain 72 with the drain contact region of the active layer 3 and the pixel electrode 10 through the second via hole and the fourth via hole.

Step 6, on the base 1 subject to the step 5, forming a pattern including a pixel defining layer (PDL) and a spacer (PS) through a single patterning process.

Figure 7:
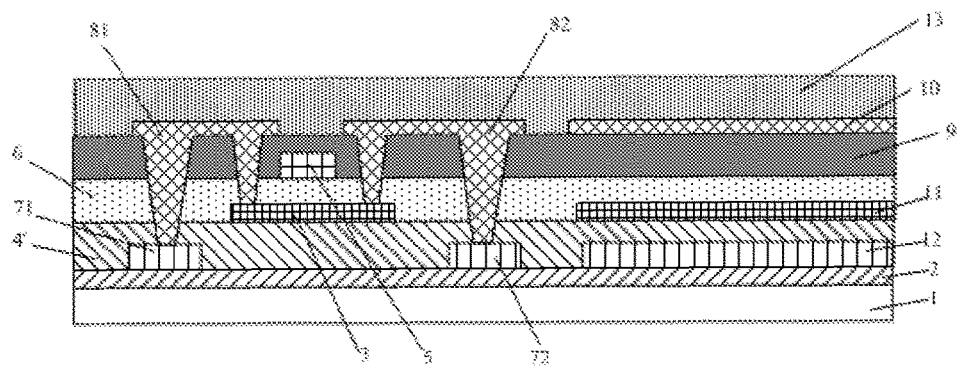
FIG. 7 is a diagram illustrating a seventh step of the manufacturing method of the array substrate in the first embodiment of the present application.

In this step, by using a half tone mask (HTM) or a gray tone mask (GTM), the pattern including the pixel defining layer and the spacer is formed from a coated material of a resin layer 13 (PI) through a single patterning process, as shown in FIG. 7.

On the basis of the above array substrate, an emitting layer (EL) is further evaporated or coated, and a metal cathode layer is finally formed by a sputtering or evaporating, thus an array substrate with OLED may be formed by encapsulation.

In this embodiment, the via holes with which the drain 72 of the thin film transistor is connected with the drain contact region of the active layer 3 and the via hole with which the drain 72 is connected with the pixel electrode 10 are formed by a single patterning process, simplifying process procedures. Also, among two plates of the storage capacitor, one of the plates is made of a same metal material as that of the drain 72 and the source 71 of the thin film transistor TFT, and the other one of the plates is made of a same material as that of the active layer 3 of the thin film transistor, thus a distance between two plates of the storage capacitor is decreased, avoiding a value of the storage capacitance from being too small.

It should be noted that, in this embodiment, the gate 5 of the thin film transistor and the source and the drain may also be provided in a same layer and manufactured through a single patterning process. At this time, the gate 5 is below the active layer 3, that is, the thin film transistor is a top-gate type thin film transistor, other steps for manufacturing the array substrate are the same as those described above and will not be described in detail herein.

Second Embodiment

This embodiment provides an array substrate, which may be manufactured by using the manufacturing method in the first embodiment, this array substrate is applicable to OLED display devices.

This array substrate comprises a base 1, thin film transistors above the base 1, storage capacitors and OLEDs.

This array substrate specifically comprises: a base 1; a source 71 and a drain 72 of the thin film transistor above the base 1; a first insulation layer 4' above a layer in which the source 71 and the drain 72 are located; an active layer 3 of the thin film transistor above the first insulation layer 4'; a second insulation layer above a layer in which the active layer 3 is located; a first connection line 81, a second connection line 82 and a pixel electrode 10 above a layer in which the second insulation layer is located, wherein the first connection line 81 connects the source 71 with a source contact region of the active layer 3 via a first via hole penetrating through the first insulation layer 4' and the second insulation layer above the source 71 and a third via hole penetrating through the second insulation layer above the source contact region of the active layer 3; the second connection line 82 connects the drain 72 with a drain contact region of the active layer 3 and the pixel electrode 10 via a second via hole penetrating through the first insulation layer 4' and the second insulation layer above the drain 72 and a fourth via hole penetrating through the second insulation layer above the drain contact region of the active layer 3.

The second insulation layer includes a gate insulation layer 6 and a planarization layer 9, the array substrate further comprises a gate 5 of the thin film transistor provided between the gate insulation layer 6 and the planarization layer 9. Furthermore, orthographic projections of the gate 5 and a conductive channel region of the active layer 3 on the base 1 completely coincide with each other, and the source contact region and the drain contact region of the active layer 3 are doped with ions. That is to say, when doping the source contact region and the drain contact region of the active layer 3 with ions, the gate 5 is used as a mask, thus one mask may be saved, reducing the process cost.

The first plate 11 of the storage capacitor and the active layer 3 are provided in a same layer and made of a same material, and the first plate 11 is doped with ions therein, the second plate 12 and the drain 71 and the source 72 are provided in a same layer and made of a same material, thus the distance between the two plates of the storage capacitor is reduced, avoiding the value of the storage capacitance from being too small. Also, since the first plate 11 of the storage capacitor and the active layer 3 are in a same layer and made of a same material, and the first plate 11 is doped with ions therein, the second plate 12 and the source 71 and the drain 72 are in a same layer and made of a same material, the first plate 11 and the active layer 3 may be formed simultaneously, and the second plate 12 and the source 71 and the drain 72 may be formed simultaneously, therefore, production cost may be decreased It should be noted that, in this embodiment, the gate 5 of the thin film transistor and the source and the drain may be provided in a same layer and manufactured through a single patterning process. At this time, the gate 5 is below the active layer 3, that is, the thin film transistor is a top-gate type thin film transistor, other components on the array substrate are the same as those described above and will not be described in detail herein.

Third Embodiment

This embodiment provides a display device, which comprises the array substrate in the first embodiment.

The display device may a liquid crystal display device or an organic light emitting diode display device, for example, any one of products and components having display function, such as a liquid crystal panel, an electronic paper, an OLED panel, a mobile phone, a tablet computer, a TV, a display, a notebook computer, a digital frame, a navigation, and the like.

The display device in this embodiment has excellent display quality.

The present application has following advantages:

In this application, the via hole with which the drain of the thin film transistor of the array substrate is connected with the drain contact region of the active layer and the via hole with which the drain is connected with the pixel electrode are formed by a single patterning process, simplifying process procedures. Also, among two plates of the storage capacitor, one of the plates is made of a same metal material as that of the drain and the source of the thin film transistor TFT, and the other one of the plates is made of a same material as that of the active layer of the thin film transistor, thus a distance between two plates of the storage capacitor is decreased, avoiding a value of the storage capacitance from being too small.

It can be understood that the foregoing implementations are merely exemplary implementations used for describing the principle of the present application, but the present application is not limited thereto. Those of ordinary skill in the art may make various variations and improvements without departing from the spirit and essence of the present application, and these variations and improvements shall fall into the protection scope of the present application.

The invention claimed is:

1. A manufacturing method of an array substrate, which comprises sequentially performed steps of:
   forming a pattern including a source and a drain of a thin film transistor on a base through a patterning process;
   forming a first insulation layer;
   forming a pattern including an active layer of the thin film transistor through a patterning process;
   forming a second insulation layer, forming a first via hole and a second via hole in the first insulation layer and the second insulation layer above the source and the drain, respectively, by etching, and forming a third via hole and a fourth via hole in the second insulation layer above a source contact region and a drain contact region of the active layer, respectively, by etching;
   forming a pattern including a first connection line, a second connection line and a pixel electrode through a patterning process, wherein the first connection line connects the source with the source contact region of the active layer through the first via hole and the third via hole, the second connection line connects the drain with the drain contact region of the active layer and the pixel electrode through the second via hole and the fourth via hole.

2. The manufacturing method of the array substrate of claim 1, wherein the step of forming the second insulation layer comprises a step of:
   forming a gate insulation layer and forming a planarization layer,
   the manufacturing method further comprises a step of:
   between forming the gate insulation layer and forming the planarization layer, forming a pattern including a gate of the thin film transistor through a patterning process.

3. The manufacturing method of the array substrate of claim 2, wherein orthographic projections of the gate and a conductive channel region of the active layer on the base completely coincide with each other, and after forming the pattern including the gate through a patterning process, the manufacturing method further comprises a step of:
   performing an ion implantation on the active layer to form the source contact region and the drain contact region.

4. The manufacturing method of the array substrate of claim 3, wherein while forming the pattern including the active layer of the thin film transistor through a patterning process, the manufacturing method further comprises a step of:
   forming a pattern including a first plate of a storage capacitor, and
   while performing the ion implantation on the active layer to form the source contact region and the drain contact region, the manufacturing method further comprises a step of:
   performing an ion implantation on the first plate of the storage capacitor.

5. The manufacturing method of the array substrate of claim 1, wherein while forming the pattern including the source and the drain of the thin film transistor through a patterning process, the manufacturing method further comprises a step of:
   forming a pattern including the gate of the thin film transistor.

6. The manufacturing method of the array substrate of claim 1, wherein while forming the pattern including the source and the drain of the thin film transistor through a patterning process, the manufacturing method further comprises a step of:
   forming a pattern including a second plate of the storage capacitor.

7. The manufacturing method of the array substrate of claim 2, wherein while forming the pattern including the source and the drain of the thin film transistor through a patterning process, the manufacturing method further comprises a step of:
   forming a pattern including a second plate of the storage capacitor.

8. The manufacturing method of the array substrate of claim 3, wherein while forming the pattern including the source and the drain of the thin film transistor through a patterning process, the manufacturing method further comprises a step of:
   forming a pattern including a second plate of the storage capacitor.

9. The manufacturing method of the array substrate of claim 1, wherein the step of forming the first via hole and the second via hole in the first insulation layer and the second insulation layer above the source and the drain, respectively, by etching;

and forming a third via hole and a fourth via hole in the second insulation layer above the source contact region and the drain contact region of the active layer, respectively, by etching specifically comprises steps of:

first, etching regions, which correspond to the first though hole and the second via hole, in the first insulation layer and the second insulation layer above the source and the drain; and next, etching regions, which correspond to the third via hole and a fourth via hole, in the second insulation layer above the source contact region and the drain contact region of the active layer.

10. The manufacturing method of the array substrate of claim 9, wherein etching gas used in etching the second insulation layer to form the third via hole and the fourth via hole is $C_xF_y$.

11. The manufacturing method of the array substrate of claim 1, wherein after the pattern including the pixel electrode is formed, the manufacturing method further comprises a step of:

forming a pattern including a pixel defining layer and a spacer through a single patterning process.

12. An array substrate comprising:
a base;
a source and a drain of a thin film transistor above the base;
a first insulation layer above a layer in which the source and the drain are located;
an active layer of the thin film transistor above the first insulation layer;
a second insulation layer above a layer in which the active layer is located;
a first connection line, a second connection line and a pixel electrode above a layer in which the second insulation layer is located, wherein
the first connection line connects the source with a source contact region of the active layer via the first via hole penetrating through the first insulation and the second insulation layer above the source and the third via hole penetrating through the second insulation layer above the source contact region of the active layer, the second connection line connects the drain with a drain contact region of the active layer and the pixel electrode via the second via hole penetrating through the first insulation layer and the second insulation layer above the drain and the fourth via hole penetrating through the second insulation layer above the drain contact region of the active layer.

13. The array substrate of claim 12, wherein the second insulation layer includes a gate insulation layer and a planarization layer, and the array substrate further comprises a gate of the thin film transistor provided between the gate insulation layer and the planarization layer.

14. The array substrate of claim 13, wherein orthographic projections of the gate and a conductive channel region of the active layer on the base completely coincide with each other, and the source contact region and the drain contact region of the active layer are doped with ions.

15. The array substrate of claim 14, further comprising a first plate of a storage capacitor, wherein the first plate and the active layer are in a same layer and are formed of a same material, and the first plate is doped with ions.

16. The array substrate of claim 12, further comprising a gate of the thin film transistor, wherein the gate and the source and the drain are in a same layer and are made of a same material.

17. The array substrate of claim 12, further comprising a second plate of the storage capacitor, wherein the second plate and the source and the drain are in a same layer and are made of a same material.

18. The array substrate of claim 13, further comprising a second plate of the storage capacitor, wherein the second plate and the source and the drain are in a same layer and are made of a same material.

19. A display device comprising the array substrate of claim 12.

20. A display device comprising the array substrate of claim 13.

* * * * *